(12) United States Patent
Mitsuhashi et al.

(10) Patent No.: US 12,213,268 B2
(45) Date of Patent: Jan. 28, 2025

(54) CASE AND ELECTRONIC DEVICE EQUIPPED WITH THE SAME

(71) Applicant: Hitachi Astemo, Ltd., Hitachinaka (JP)

(72) Inventors: Naoya Mitsuhashi, Tokyo (JP); Akira Inoue, Tokyo (JP); Masaru Kamoshida, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 177 days.

(21) Appl. No.: 17/924,490

(22) PCT Filed: Feb. 5, 2021

(86) PCT No.: PCT/JP2021/004258
§ 371 (c)(1),
(2) Date: Nov. 10, 2022

(87) PCT Pub. No.: WO2021/240894
PCT Pub. Date: Dec. 2, 2021

(65) Prior Publication Data
US 2023/0189464 A1    Jun. 15, 2023

(30) Foreign Application Priority Data

May 29, 2020 (JP) ................................ 2020-094680

(51) Int. Cl.
*H05K 5/02* (2006.01)
*H05K 5/03* (2006.01)
*H05K 7/14* (2006.01)

(52) U.S. Cl.
CPC ............. *H05K 5/03* (2013.01); *H05K 7/1432* (2013.01)

(58) Field of Classification Search
CPC . H05K 5/0017; H05K 5/0217; H05K 57/1432
(Continued)

(56) References Cited

U.S. PATENT DOCUMENTS

| 2010/0060604 | A1 | 3/2010 | Zwart et al. | |
| 2011/0007419 | A1* | 1/2011 | Kubo | G11B 25/043 360/99.15 |
| 2014/0291340 | A1* | 10/2014 | Yamana | H01L 21/67333 220/788 |

FOREIGN PATENT DOCUMENTS

| EP | 1396403 A2 * | 3/2004 | ............. B60T 8/368 |
| JP | 2004-173465 A | 6/2004 | |

(Continued)

OTHER PUBLICATIONS

International Search Report (PCT/ISA/210) issued in PCT Application No. PCT/JP2021/004258 dated May 18, 2021 with English translation (four (4) pages).

(Continued)

*Primary Examiner* — Hung S. Bui
(74) *Attorney, Agent, or Firm* — Crowell & Moring LLP

(57) ABSTRACT

Provided are a case having a structure with a high degree of freedom in the adjustment of natural vibration and capable of suppressing vibration without excessively increasing the weight, and an electronic device equipped with the same. A case 3 includes a case body 10 having an accommodating space 10b capable of accommodating a circuit substrate 2 and being opened to one side, and a cover 20 attached to the case body 10 so as to close the opening of the case body 10. The cover 20 includes an annular first region portion 21 in contact with the case body 10, a second region portion 22 located on an inner peripheral side of the first region portion 21, a third region portion 23 located between the first region portion 21 and the second region portion 22 and connected to the first region portion 21 and the second region portion 22, and a rib 25 extending on the third region portion 23 and connected to the second region portion 22. The second region portion 22 is configured such that the mass per unit area when viewed from the attachment direction D of the (Continued)

cover 20 to the case body 10 is larger than the third region portion 23. The rib 25 has a notch 26 provided at a position excluding a distal end portion in the extending direction thereof.

8 Claims, 5 Drawing Sheets

(58) Field of Classification Search
USPC .................. 361/807, 728, 752, 809, 810
See application file for complete search history.

(56) References Cited

FOREIGN PATENT DOCUMENTS

| | | | |
|---|---|---|---|
| JP | 2006041373 A * | 2/2006 | ............... H05K 5/06 |
| JP | 6156206 B2 * | 7/2017 | .............. H02M 7/48 |
| KR | 10-2016-0033437 A | 3/2016 | |
| WO | WO 2016/006361 A1 | 1/2016 | |

OTHER PUBLICATIONS

Japanese-language Written Opinion (PCT/ISA/237) issued in PCT Application No. PCT/JP2021/004258 dated May 18, 2021 (three (3) pages).

* cited by examiner

CASE AND ELECTRONIC DEVICE EQUIPPED WITH THE SAME

TECHNICAL FIELD

The present invention relates to cases that accommodates an electric circuit or the like and electronic devices equipped with the same, and more specifically to a case attached to an apparatus serving as a vibration source and an electronic device equipped with the same.

BACKGROUND ART

Introduction of electric vehicles is in progress for environmental response. For a diving unit for an electric vehicle, size reduction and weight reduction are required from the standpoint of mountability and efficiency, and noise reduction is required from the standpoint of comfort. In a case where the diving unit includes, for example, a motor, a gear, and an inverter, vibration caused by an electromagnetic excitation force of the motor or a meshing force of the gear is propagated to a case of the inverter and a radiation sound is generated, and hence the radiation sound from the case of the inverter needs to be suppressed. However, the case cover of the inverter tends to be thinned with size reduction and weight reduction of the diving unit, and there is a concern that vibration of the cover increases by decrease in rigidity due to the thinning.

As a measure for suppressing the radiation sound from the case due to propagation of the vibration, for example, a technique described in PTL 1 has been proposed. In an accommodation structural body of an electronic component described in PTL 1, a case for accommodating an electronic component is formed of a first member (upper case) and a second member (lower case), and the first member (upper case) and the second member (lower case) are fastened by a fastening member. The upper case has a fastening portion fastened on a surface thereof by a fastening member. The upper case is a member formed as a lid (cover) of the lower case which is a main body portion that accommodates the electronic component, and has a structure of having lower rigidity and being more likely to vibrate than the lower case. A rib is thus provided to lie along a direction from a predetermined position on the surface of the upper case toward the fastening portion.

CITATION LIST

Patent Literature

PTL 1: WO 2016/006361 A

SUMMARY OF INVENTION

Technical Problem

In the accommodation structural body described in PTL 1, higher rigidity of the upper case and reduction of the vibration are achieved by providing a rib from a center portion (position of the antinode of the vibration) of the upper case toward the fastening portion having high rigidity located at the outer peripheral portion.

However, when attempting to suppress the vibration of the upper case by increasing the rigidity with the rib, the rigidity of a region different from the region where the rib is provided becomes relatively low, and thus the position of the antinode of the vibration may move to the region of relatively low rigidity. When a new rib is added to increase the rigidity of the region where the antinode of the moved vibration is located, a large number of ribs are installed as a result, and the weight of the upper case may become excessively large.

In addition, when the rigidity of the upper case is increased by the rib, the frequency of the primary vibration (primary natural frequency) of the membrane surface of the upper case increases. At this time, the primary natural frequency may change from 1 kHz to 5 kHz. When the frequency is in the range of 1 kHz to 5 kHz, human hearing sensitivity is relatively high, whereas when the frequency is less than 1 kHz, human hearing sensitivity lowers as the frequency lowers. Therefore, it is desirable to suppress the primary natural frequency that changed when the rigidity of the upper case is increased to less than 1 kHz at which the human hearing sensitivity is low. In addition, the upper case before the installation of the rib has lower rigidity than the lower case and has no problem of resonance with the lower case, but the upper case after the installation of the rib has a concern of resonance with the lower case due to increase in rigidity. As described above, it is difficult to reduce the vibration of the upper case while adjusting the primary natural frequency of the upper case to a frequency at which human hearing sensitivity is low and a frequency at which resonance with other members does not occur only by installing the rib with respect to the upper case.

The present invention has been made to solve the above problems, and an object of the present invention is to provide a case having a structure with a high degree of freedom in adjustment of a natural frequency of a member and capable of suppressing vibration without excessively increasing the weight, and an electronic device equipped with the same.

Solution to Problem

The present application includes a plurality of means for solving the above problems, one example of which being a case including a case body interiorly including an accommodating space in which an electric circuit is accommodatable, and being opened to one side; and a cover attached to the case body so as to close an opening of the case body, where the cover includes an annular first region portion in contact with the case body, a second region portion located on an inner peripheral side of the first region portion, a third region portion located between the first region portion and the second region portion, and connected to the first region portion and the second region portion, and a reinforcement portion extending on the third region portion and being connected to the second region portion, the second region portion is configured such that a mass per unit area when viewed from an attachment direction of the cover to the case body is larger than that of the third region portion, and the reinforcement portion is provided with a notch at a position excluding a distal end portion in an extending direction of the reinforcement portion.

Advantageous Effects of Invention

According to the present invention, by providing the notch with respect to the reinforcement portion connected to the second region portion, the position of the notch becomes relatively low rigidity in the third region portion where the reinforcement portion is provided, and thus the position of the second region portion having a relatively large weight becomes a portion that is relatively likely to vibrate, and the vibration can be suppressed without excessively increasing the weight of the second region portion. Furthermore, the natural frequency of the cover can be adjusted to a frequency at which human hearing sensitivity is low and a frequency at which resonance with other members does not occur by adjusting a combination of a shape such as a position, a length, a width, and a height of the reinforcement portion and a shape such as a position, a length, and a depth of the notch. That is, the structure has a high degree of freedom in adjustment of the natural frequency of the member, and the vibration can be suppressed without excessively increasing the weight.

Problems, configurations, and effects other than those described above will be clarified by the description of the following embodiments.

DESCRIPTION OF EMBODIMENTS

Hereinafter, embodiments of a case and an electronic device equipped with the same according to the present invention will be described with reference to the drawings. The present embodiment has been described using a case where an electronic device of the present invention is applied to an inverter for a rotation electrical machine by way of example.

First Embodiment

Figure 1:
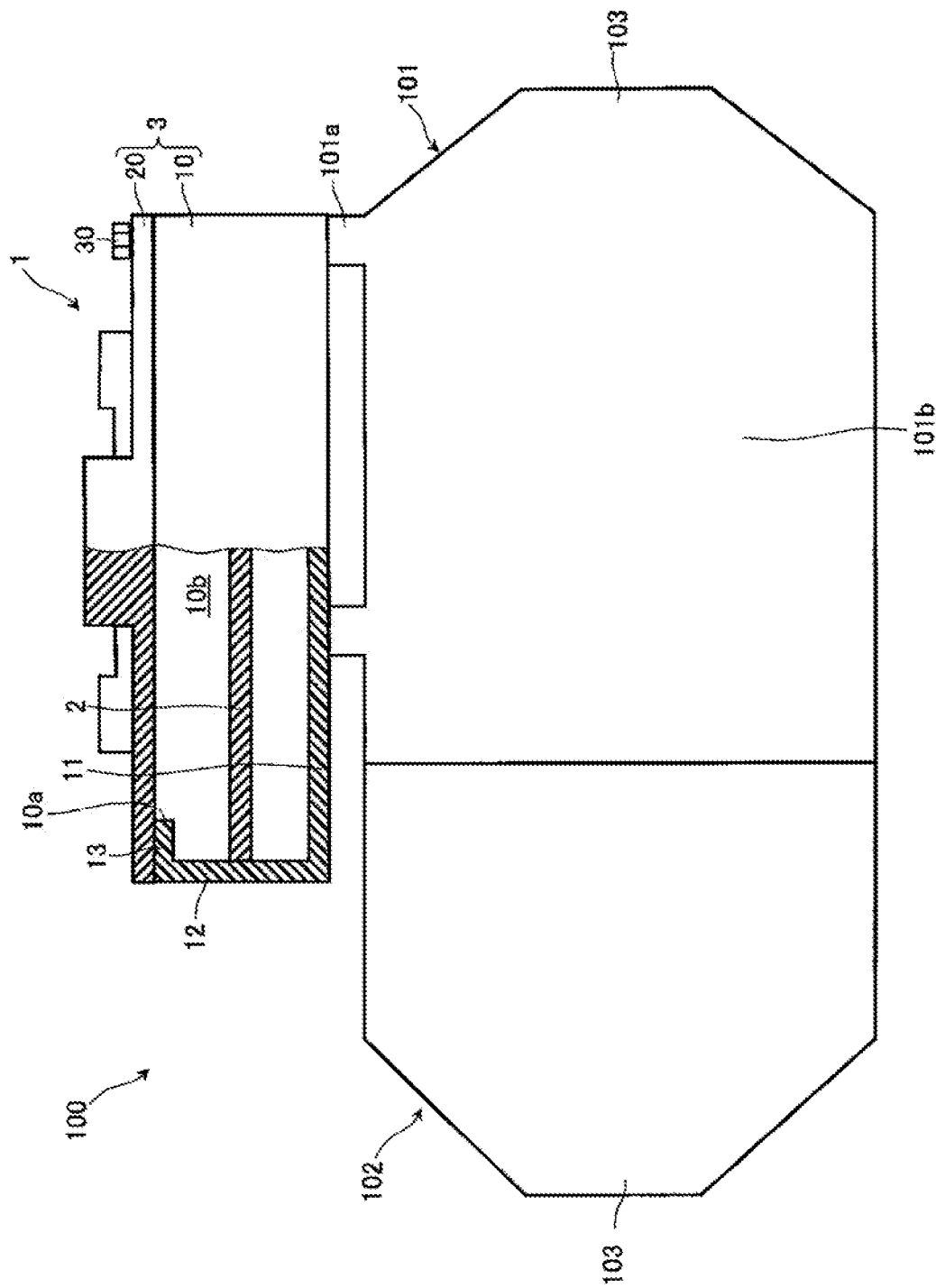
FIG. 1 is a schematic view illustrating a drive unit for a vehicle including an electronic device according to a first embodiment of the present invention in a partially sectional state.

First, a configuration of an inverter as an electronic device according to a first embodiment of the present invention and a vehicle diving unit equipped with the same will be described with reference to FIG. 1. FIG. 1 is a schematic view illustrating a drive unit for a vehicle including an electronic device according to a first embodiment of the present invention in a partially sectional state.

In FIG. 1, a drive unit 100 is used as a drive source of an electric vehicle such as an electric car or a hybrid vehicle, and is mounted on a vehicle. The drive unit 100 includes, for example, a rotation electrical machine 101, a transmission 102, and an inverter 1 as an electronic device. The rotation electrical machine 101 and the transmission 102 are coupled to each other, and a drive shaft (not shown) that drives a tire (not shown) is coupled to an end portion 103 of an output shaft of the drive unit 100.

The inverter 1 is fixed to the rotation electrical machine 101 by way of an attachment portion 101a. The rotation electrical machine 101 functions as, for example, an electric motor, and a rotor and a stator (both not illustrated) are accommodated in a housing 101b. The rotation electrical machine 101 vibrates due to an electromagnetic excitation force generated in a gap between the rotor and the stator at the time of driving, thereby serving as an excitation source of the inverter 1. The transmission 102 is a mechanism that converts and transmits the rotational speed and torque of the driving force, and converts the rotational speed and torque of the rotation electrical machine 101 and transmits the converted rotational speed and torque to the drive shaft. The inverter 1 converts DC power from a battery or the like (not illustrated) into AC power and supplies the AC power to the rotation electrical machine 101, and controls the supply of power to the rotation electrical machine 101. In the drive unit 100, a driving torque or a braking torque is generated by a command from the inverter 1.

The inverter 1 includes a circuit substrate 2 that is an electric circuit for controlling electric power, and a case 3 that accommodates the circuit substrate 2. The circuit substrate 2 has various electronic components (not illustrated) mounted on the substrate. The case 3 includes, for example, a bottomed tubular case body 10 having an opening 10a into which the circuit substrate 2 can be inserted and interiorly including an accommodating space 10b in which the circuit substrate 2 can be accommodated, and a cover 20 detachably attached to the case body 10 so as to close the opening 10a of the case body 10.

The case body 10 includes, for example, a bottom portion 11 attached to the attachment portion 101a of the rotation electrical machine 101, a tubular side wall portion 12 rising from an outer peripheral edge portion of the bottom portion 11, and an annular flange portion 13 protruding to the radially inner side from an opening edge portion of the side wall portion 12. For example, the bottom portion 11 is a rectangular plate-shaped portion in which one side is long, and the side wall portion 12 is a square tubular portion. The flange portion 13 is a portion that functions as an attachment portion for attaching the cover 20. The case body 10 is fastened to the attachment portion 101a of the rotation electrical machine 101 with a bolt (not shown). For example, an outer peripheral portion of the cover 20 is fastened to the flange portion 13 of the case body 10 with a bolt 30. A detailed structure of the cover 20 will be described later.

Vibration at the time of driving of the drive unit 100 propagates to the case 3. Specifically, vibrations generated in the rotation electrical machine 101 and the transmission 102 are first propagated to the case body 10 of the case 3 through the attachment portion 101a, and then propagated to the cover 20 through a contact portion between the case body 10 and the cover 20.

The cover of the conventional case generally has a structure that has lower rigidity and is more likely to vibrate than other members such as the housing 101b of the rotation electrical machine 101 and the case body of the case. Therefore, the vibration propagated to the cover in the related art is amplified, so that the radiation sound from the cover in the related art may be increased.

Figure 2:
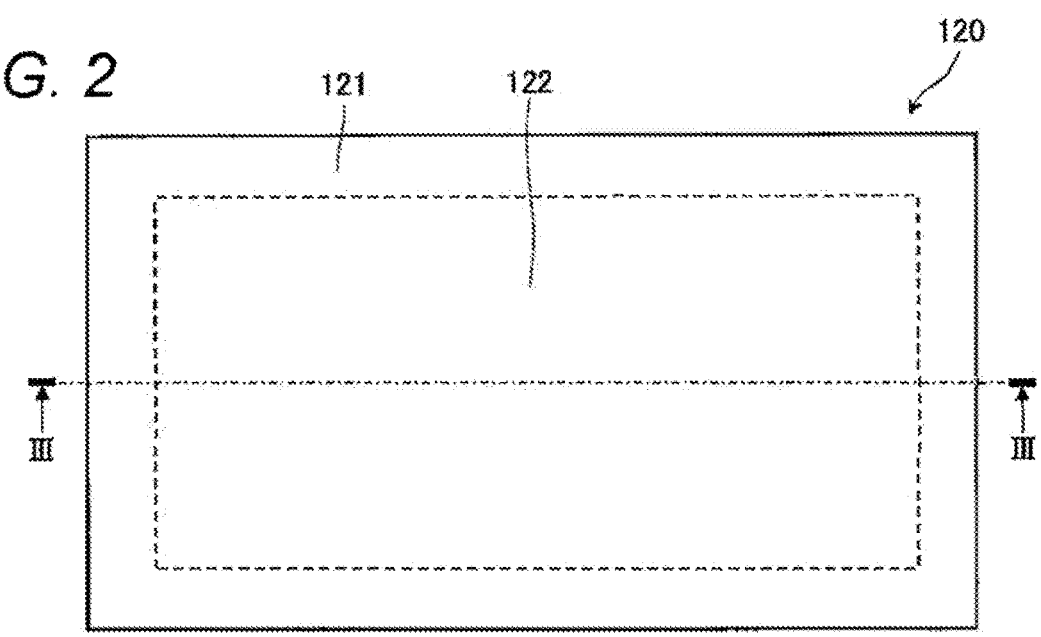
FIG. 2 is a plan view illustrating a flat plate-shaped cover of a conventional case.
Figure 3:
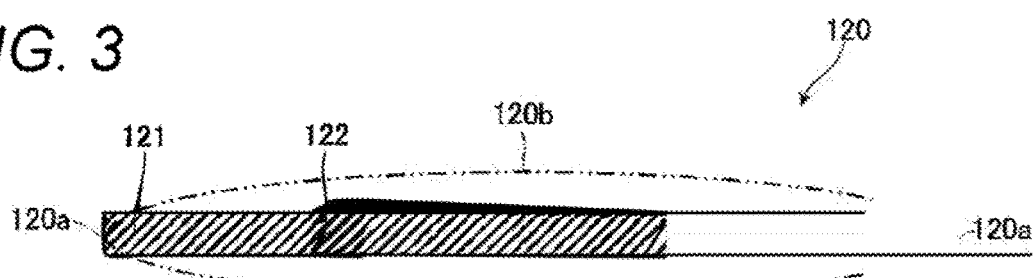
FIG. 3 is a cross-sectional view of the conventional flat plate-shaped cover illustrated in FIG. 2 as viewed along an arrow III-III, and is an explanatory view illustrating a primary vibration mode of the cover.

Next, a structure of a conventional cover and its vibration will be described with reference to the drawings. First, a structure of a conventional flat plate-shaped cover and its vibration will be described with reference to FIGS. 2 and 3. FIG. 2 is a plan view illustrating a flat plate-shaped cover of a conventional case. FIG. 3 is a cross-sectional view of the conventional flat plate-shaped cover illustrated in FIG. 2 as viewed along an arrow III-III. Note that in FIGS. 2 and 3, the components denoted by the same reference numerals as those in FIG. 1 are the same components, and the description thereof will be omitted.

In FIGS. 2 and 3, the conventional flat plate-shaped cover 120 is a flat plate-shaped member attached to the case body 10 (see FIG. 1) having a rectangular opening 10a. The flat plate-shaped cover 120 includes annular outer peripheral portion 121 that comes into contact with the case body 10, and a main body portion 122 surrounded by the outer peripheral portion 121. The outer peripheral portion 121 of the flat plate-shaped cover 120 is attached to the case body 10 to have higher rigidity than the main body portion 122. The flat plate-shaped cover 120 is formed in a rectangular shape that is long in one direction (left and right direction in FIGS. 2 and 3).

A two-dot chain line in FIG. 3 indicates a primary vibration mode of the flat plate-shaped cover 120. When the flat plate-shaped cover 120 is rectangular, the outer peripheral portion 121 of the flat plate-shaped cover 120 serves as a node 120a in the primary vibration mode, and the central portion of the main body portion 122 serves as the antinode (position where the amplitude is maximum) 120b in the primary vibration mode.

The conventional flat plate-shaped cover 120 has a structure that has lower rigidity and is more likely to vibrate than other members such as the housing 101b (see FIG. 1) of the rotation electrical machine 101 and the case body 10 of the case. Therefore, the vibration of the driving portion of the drive unit 100 (see FIG. 1) is propagated to the flat plate-shaped cover 120 through the case body 10 of the case, so that the main body portion 122 of the flat plate-shaped cover 120 vibrates and the radiation sound becomes large. As a conventional method for reducing the vibration of the conventional flat plate-shaped cover 120, weight increase of a part of the flat plate-shaped cover 120, installation of a rib, and the like can be cited.

Figure 4:
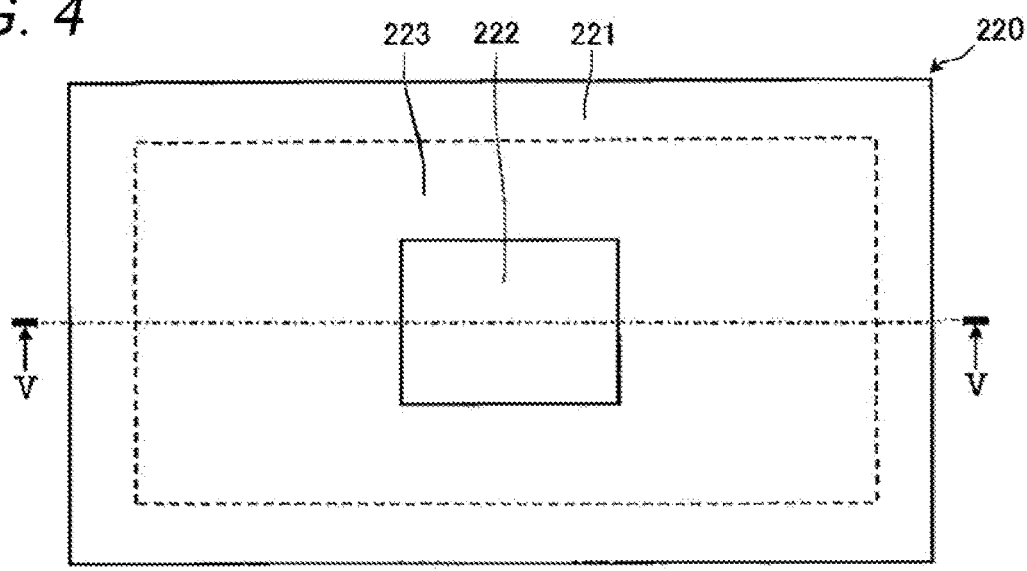
FIG. 4 is a plan view illustrating a cover of a first comparative example of a conventional structure in which a structural portion for increasing weight is added to a conventional flat plate-shaped cover.
Figure 5:
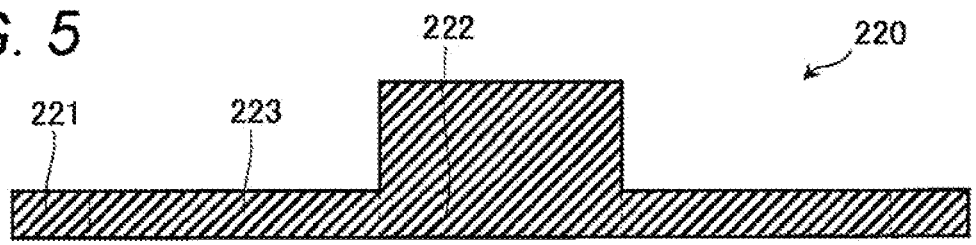
FIG. 5 is a cross-sectional view of the cover of the first comparative example illustrated in FIG. 4 as viewed along an arrow V-V.

Next, a cover of a first comparative example having a conventional structure capable of reducing vibration of a conventional flat plate-shaped cover will be described with reference to FIGS. 4 and 5. FIG. 4 is a plan view illustrating a cover of a first comparative example in which a structural portion for increasing weight is added to the conventional flat plate-shaped cover. FIG. 5 is a cross-sectional view of the cover of the first comparative example illustrated in FIG. 4 as viewed along an arrow V-V.

In FIGS. 4 and 5, the cover 220 of the first comparative example of the related art is obtained by increasing the weight of a region having a large amplitude in the conventional flat plate-shaped cover 120 (see FIGS. 2 and 3) more than other regions. Specifically, the cover 220 of the first comparative example includes an annular outer peripheral portion 221 in contact with the case body 10 (see FIG. 1), a weight portion 222 located on the inner peripheral side of the outer peripheral portion 221, and a main body portion 223 located between the outer peripheral portion 221 and the weight portion 222 and connected to the outer peripheral portion 221 and the weight portion 222.

The rigidity of the outer peripheral portion 221 is increased by being attached to the case body 10. The main body portion 223 is an annular plate-shaped portion extending from the outer peripheral edge of the weight portion 222 to the inner peripheral edge of the outer peripheral portion 221, and is a portion having relatively lower rigidity than the outer peripheral portion 221 and the weight portion 222. The weight portion 222 is configured such that a mass (weight) per unit area is relatively larger than that of the main body portion 223, and is a portion thicker than the main body portion 223. The weight portion 222 is disposed at a position of a central portion of the cover 220.

In the cover 220 of the first comparative example, the arrangement of the weight portion 222 is set such that the center of the weight portion 222 is located at the antinode position of the primary vibration mode of the cover 220, whereby the effect of suppressing vibration by the weight portion 222 of the cover 220 can be exhibited. However, in a case where the cover shape is other than a simple shape such as a rectangular shape or a circular shape, the rigidity of the entire cover 220 changes with the thickening of a certain portion, and thus, the position of the antinode of the primary vibration mode of the cover 220 may appear in the vicinity of the outer edge portion of the weight portion 222. In this case, as compared with a case where the position of the antinode of the primary vibration mode is in the vicinity of the central portion of the weight portion 222, the effect of suppressing vibration is not sufficiently exhibited, and thus there is a concern that suppression of vibration cannot be achieved unless the weight is excessively increased.

Figure 6:
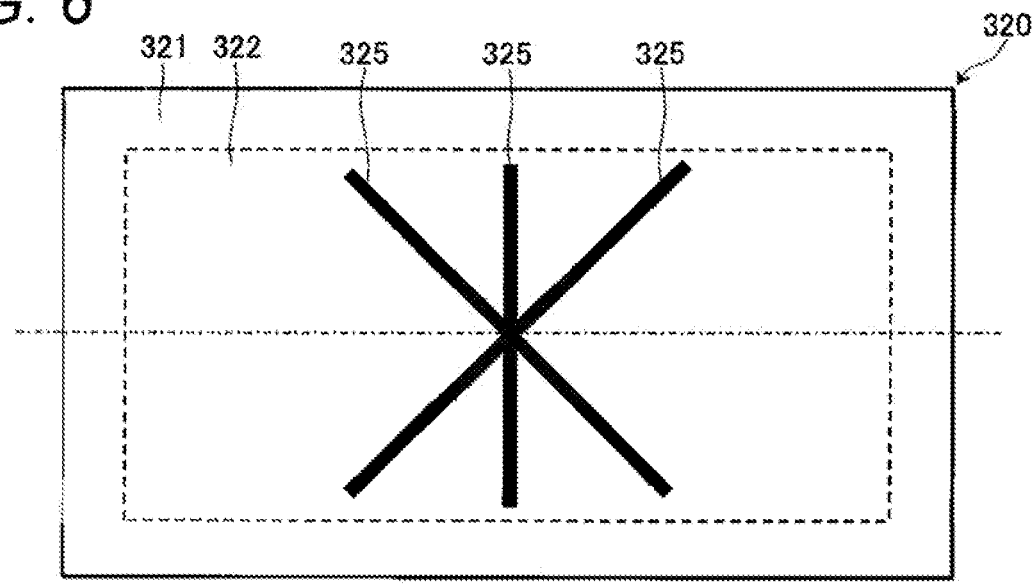
FIG. 6 is a plan view illustrating a cover of a second comparative example of the conventional structure in which a rib is added to the conventional flat plate-shaped cover.

Next, a cover of a second comparative example having the conventional structure for vibration of reducing a conventional flat plate-shaped cover will be described with reference to FIG. 6. FIG. 6 is a plan view illustrating a cover of a second comparative example of the conventional structure in which a rib is added to the conventional flat plate-shaped cover.

In FIG. 6, the cover 320 of the conventional second comparative example is obtained by adding a rib 325 for reinforcement to the conventional flat plate-shaped cover 120 (see FIGS. 2 and 3). Specifically, the cover 320 of the second comparative example includes an annular outer peripheral portion 321 in contact with the case body 10 (see FIG. 1), a main body portion 322 surrounded by the outer peripheral portion 321, and a rib 325 provided on the main body portion 322.

The rigidity of the outer peripheral portion 321 is increased by being attached to the case body 10. The rib 325 increases the rigidity of the main body portion 322, and a plurality of ribs are provided on the main body portion 322. The rib 325 extends from the vicinity of the outer peripheral portion 321 having high rigidity to the central portion of the main body portion 322 (the position of the antinode of the primary vibration mode). The vibration of the cover 320 of the second comparative example is reduced by increasing the rigidity of the central portion (the position of the antinode of the primary vibration mode) of the main body portion 322 by the plurality of ribs 325.

However, when the vibration of the cover 320 is to be suppressed by installing the rib 325, the rigidity of a region different from the installation region of the rib 325 in the main body portion 322 becomes relatively low, and thus the antinode of the primary vibration mode may move to the region of low rigidity. In this case, it becomes necessary to add a new rib on the main body portion 322, and as a result, there is a concern that the cover weight becomes excessively large due to the installation of a large number of ribs.

In addition, when suppressing the vibration of the cover 320 of the second comparative example by increasing the rigidity by the rib 325, the primary natural frequency of the cover 320 becomes higher than that before the installation of the rib 325. At this time, the natural frequency may change within a range of 1 kHz to 5 kHz. When the frequency is in the range of 1 kHz to 5 kHz, human hearing sensitivity is relatively high, whereas when the frequency is less than 1 kHz, human hearing sensitivity lowers as the frequency lowers. Therefore, it is desirable that the primary natural frequency of the cover 320 be less than 1 kHz without being changed within the range of 1 kHz to 5 kHz. In addition, the cover before the rib 325 is installed has a lower rigidity than the housing 101b (see FIG. 1) of the rotation electrical machine 101 and the case body 10, and has no problem of resonance with other members such as the case body 10, but the cover 320 of the second comparative example after the rib 325 is installed has a concern that resonance with other members may occur due to an increase in the primary natural frequency by increase in rigidity. From the above, it is difficult to reduce the vibration of the cover 320 while adjusting the primary natural frequency of the cover 320 of the second comparative example to a frequency at which human hearing sensitivity is low and a frequency at which resonance with other members does not occur only by installing the ribs 325.

Figure 7:
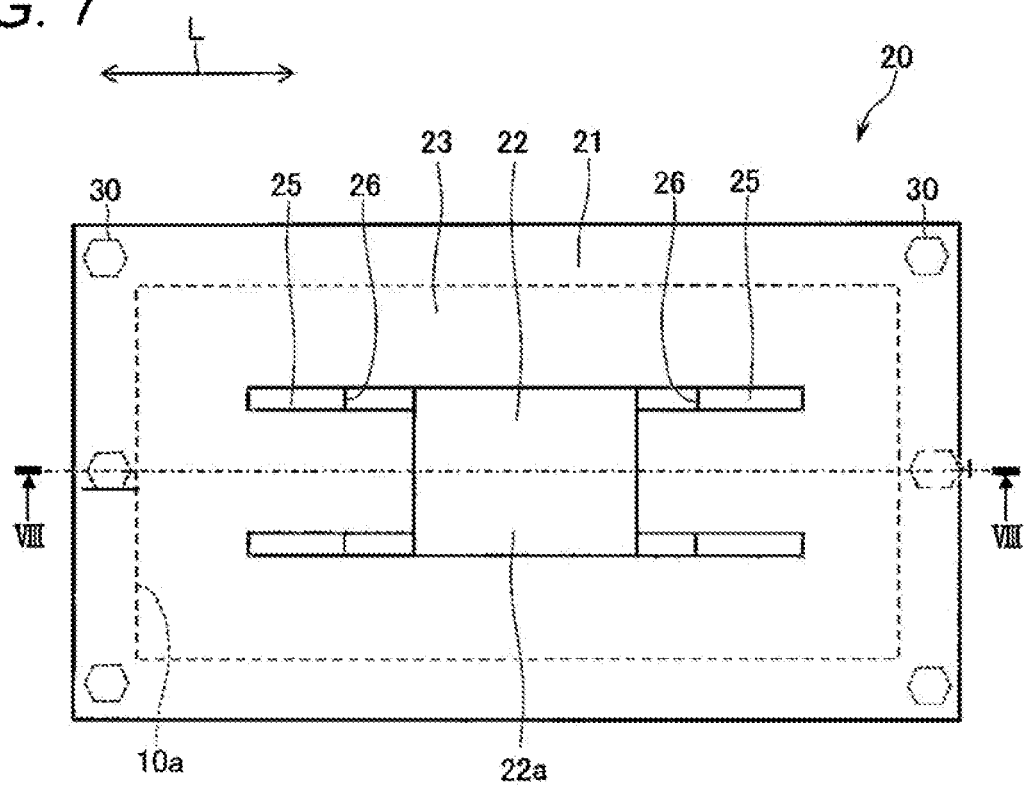
FIG. 7 is a plan view illustrating a cover of a case in an electronic device according to the first embodiment of the present invention illustrated in FIG. 1.
Figure 8:
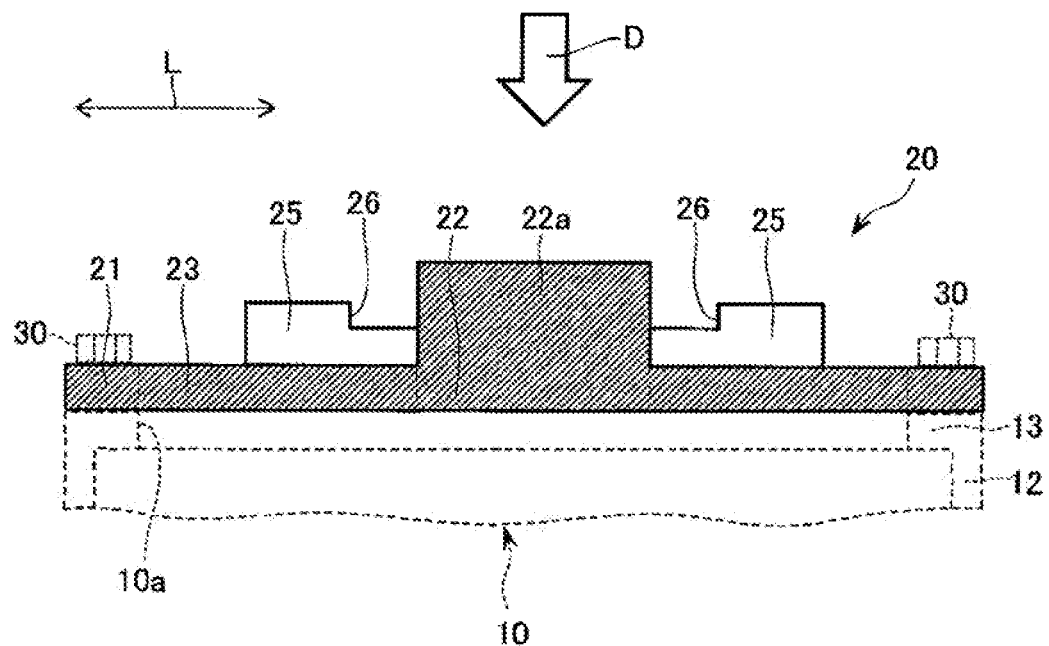
FIG. 8 is a cross-sectional view of the cover of the case according to the first embodiment of the present invention illustrated in FIG. 7 as viewed along an arrow VIII-VIII.

Therefore, the cover 20 according to the present embodiment has the following structure to suppress vibration. Next, a structure of the cover constituting the case according to the first embodiment of the present invention will be described with reference to FIGS. 7 and 8. FIG. 7 is a plan view illustrating a cover of a case in an electronic device according to the first embodiment of the present invention illustrated in FIG. 1. FIG. 8 is a cross-sectional view of the cover of the case according to the first embodiment of the present invention illustrated in FIG. 7 as viewed along an arrow VIII-VIII.

In FIGS. 7 and 8, the cover 20 has a plate-shaped portion that closes the opening 10a of the case body 10 as a basic structure, and further has a structural portion that increases the weight of only a certain region of the plate-shaped portion and a structural portion that increases the rigidity of the plate-shaped portion. Specifically, the cover 20 includes an annular first region portion 21 in contact with the flange portion 13 of the case body 10, a second region portion 22 serving as a weight portion located on an inner peripheral side of the first region portion 21, and a third region portion 23 located between the first region portion 21 and the second region portion 22 and connected to the first region portion 21 and the second region portion 22. The cover 20 is, for example, a rectangular member having a longitudinal direction L that is long in one direction (left and right direction in FIG. 7) according to the shape of the opening 10a of the case body 10 when viewed from the attachment direction D (see FIG. 8) to the case body 10 (see FIG. 7). The cover 20 is formed, for example, by integrally molding the first region portion 21, the second region portion 22, and the third region portion 23.

The first region portion 21 is, for example, a plate-shaped portion integrated with the third region portion 23, and constitutes the outer peripheral portion of the cover 20. The first region portion 21 has a surface on one side (in FIG. 8, the lower surface) serving as a contact surface with the flange portion 13. The first region portion 21 has a higher rigidity by being fastened to the flange portion 13 by the bolt 30.

The third region portion 23 is a portion surrounding the second region portion 22 and surrounded by the first region portion 21. The third region portion 23 is, for example, an annular plate-shaped portion extending from the outer peripheral edge of the second region portion 22 to the inner peripheral edge of the first region portion 21, and is a portion having a relatively lower rigidity than the first region portion 21 and the second region portion 22.

The second region portion 22 is configured such that the mass (weight) per unit area when viewed from the attachment direction D of the cover 20 to the case body 10 (the thickness direction of the third region portion 23 of the cover 20 or the direction orthogonal to the contact surface of the first region portion 21) is relatively larger than the third region portion 23. The second region portion 22 is, for example, a portion thicker than the third region portion 23, and bulges out to the external side of the case 3 (see FIG. 1) than the third region portion 23. A bulging portion 22a of the second region portion 22 is formed in, for example, a rectangular parallelepiped shape that is long in one direction (left and right direction in FIGS. 7 and 8) corresponding to the shape of the cover 20. The position of the second region portion 22 is set such that the position of the antinode (position where the amplitude is maximum) of the primary vibration mode of the cover 20 is included in the range of the second region portion 22. The position of the second region portion 22 is preferably set such that the center of the second region portion 22 is located at the antinode of the primary vibration mode of the cover 20. For example, the second region portion 22 is located at a substantially central portion of the cover 20 when viewed from the attachment direction D of the cover 20 to the case body 10.

The second region portion 22 is, for example, integrally molded with the third region portion 23.

A reinforcement portion 25 that increases rigidity of the third region portion 23 is extended on the third region portion 23 so as to be connected to the second region portion 22. Specifically, the reinforcement portion 25 includes, for example, four ribs provided on the outer surface side of the third region portion 23 (the surface on the external side of the case 3). For example, the four ribs 25 are connected in correspondence with four corners extending in the bulging direction (in FIG. 8, the up and down direction) in the rectangular parallelepiped bulging portion 22a of the second region portion 22, and are extended to a substantially middle point of the third region portion 23 along the longitudinal direction L of the cover 20. That is, each rib 25 is connected to the second region portion 22, but has not reached the first region portion 21. Among the four ribs 25, two ribs 25 adjacent in the short-side direction of the cover 20 are disposed so as to face each other. For example, the rib 25 is integrally molded with the second region portion 22 and the third region portion 23.

Each rib 25 serving as the reinforcement portion has a notch 26 provided at a position excluding a distal end portion in the extending direction. The notch 26 is formed, for example, from a central portion in the extending direction of the rib 25 to a position reaching the second region portion 22. The depth of the notch 26 is set to about ⅓ of the height of the rib 25, for example, as illustrated in FIG. 8.

The shape of the rib 25 such as the length, width (thickness), and height of the rib 25 and the shape of the notch 26 such as the position, length, and depth of the notch 26 are set such that the position of the antinode of the primary vibration mode of the cover 20 is within the range of the second region portion 22. Furthermore, the shapes of the rib 25 and the notch 26 are set so as to avoid the primary natural frequency of the cover 20 from becoming a region of a natural frequency of another member such as the case body 10 or a region of a frequency at which human hearing sensitivity is high (e.g., a range of 1 kHz to 5 kHz.). In other words, the position of the antinode of the primary vibration mode of the cover 20 can be changed by adjusting various parameters of the rib 25 and the notch 26. Furthermore, the primary natural frequency of the cover 20 can be set to a frequency range within a predetermined range by adjusting various parameters of the rib 25 and the notch 26.

Next, operations and effects of the cover constituting a part of the case according to the first embodiment of the present invention will be described with reference to FIGS. 7 and 8.

In the present embodiment, as shown in FIGS. 7 and 8, the notch 26 is provided at a position excluding the distal end portion with respect to the rib 25 provided in the third region portion 23. As a result, the rigidity of the portion in the vicinity of the second region portion 22 (weight portion) in the third region portion 23 increased in rigidity by the rib 25 can be intentionally lowered by the notch 26. As a result, since a region having a relatively large amplitude is generated in or at the periphery of the second region portion 22 (weight portion), the vibration having a relatively large amplitude can be further suppressed by the relatively heavy weight second region portion 22 as compared with a case where the notch 26 is not provided in the rib 25. Therefore, the radiation sound from the cover 20 is reduced. Note that in order to concentrate a region having a relatively large amplitude to the second region portion 22 (weight portion), it is desirable to provide the notch 26 up to a position reaching the second region portion 22 as illustrated in FIGS. 7 and 8.

In addition, in the cover 20 according to the present embodiment, the position of the antinode of the primary vibration mode of the cover 20 can be moved by adjusting the position of the notch 26 and the shape such as the length and the height of the notch 26 in addition to the adjustment of the installation position of the rib 25, the shape such as the length, the height, and the width (thickness) of the rib 25, and the number of ribs 25. Therefore, as compared with the cover 220 of the conventional first comparative example (see FIGS. 4 and 5) including the weight portion 222 but having no rib, the position of the antinode of the primary vibration mode of the cover 20 can be easily adjusted to the central portion of the second region portion 22 (weight portion) by the rib 25 and the notch 26. That is, as compared with the cover 220 of the conventional first comparative example, the effect of suppressing vibration by the second region portion 22 serving as the weight portion can be more effectively exhibited. Therefore, the vibration of the cover 20 can be suppressed without excessively increasing the weight.

Furthermore, in the cover 20 according to the present embodiment, the primary natural frequency of the cover 20 can be changed by adjusting the position and shape of the notch 26 in addition to the adjustment of the installation position, shape, and number of the ribs 25. That is, there are many design parameters for setting the primary natural frequency of the cover 20 for the rib 25 and the notch 26. Therefore, the primary natural frequency of the cover 20 can be adjusted to a frequency range in which human hearing sensitivity is low and a frequency range in which resonance with other members does not occur by adjusting the rib 25 and the notch 26. When the frequency at which the excitation force of the cover 20 is amplified is known, the frequency range can be easily avoided by adjusting the rib 25 and the notch 26.

Meanwhile, since the sensitivity of human hearing becomes lower at lower frequencies at a frequency of less than or equal to 1 kHz, it is conceivable to set the primary natural frequency of the cover 20 to a low frequency by adjusting the rib 25 and the notch 26. However, in the drive unit 100 (see FIG. 1) for an electric vehicle, if the primary natural frequency of the cover 20 is set too low toward the low frequency side, the vibration of the drive unit 100 always passes the primary natural frequency (resonance point) of the cover 20 at the time of acceleration in the low speed range of the drive unit 100. Therefore, a structure of a cover in which the frequency of the primary vibration mode can be easily adjusted is desired so that both the frequency related to the sensitivity of human hearing and the frequency at the time of acceleration of the vehicle can be balanced.

In the cover 20 according to the present embodiment, the installation position, the shape, and the number of the ribs 25 on the third region portion 23, the position and the shape of the notch 26, and the weight and the thickness of the second region portion 22 can be used as an adjustment margin of the natural frequency of the cover 20. Therefore, as compared with the covers 220 and 320 (see FIGS. 4 to 6) of the first comparative example and the second comparative example, there are many adjustment margins of the natural frequency of the cover 20, and it is easy to satisfy both the reduction in the vibration of the cover 20 and the design of the natural frequency of the cover 20.

Furthermore, in the cover 20 according to the present embodiment, a region where the amplitude is relatively large in the third region portion 23 can be reduced as compared with the covers 220 and 320 of the first comparative example and the second comparative example of the related art by adjusting the position and shape of the notch 26 in addition to the adjustment of the installation position, the shape, and the number of the ribs 25.

In the present embodiment, the principle objective is to suppress vibration at the frequency of the primary vibration mode of the cover 20, and as shown in FIGS. 7 and 8, a plurality of (four in FIG. 7) ribs 25 are provided on the third region portion 23 along the longitudinal direction L of the cover 20. However, in the drive unit 100, vibration of a low frequency mainly occurs due to the influence of the meshing force of the gears of the transmission 102, while vibration in a range from a low frequency to a high frequency occurs due to the influence of the electromagnetic excitation force of the rotation electrical machine 101. Therefore, not only the vibration of low frequency but also vibration of high frequency can be suppressed simultaneously by adjusting the installation position of the rib 25 so as to pass through the position of the antinode of the high order (high frequency) vibration mode or adjusting the number of ribs 25.

The case 3 and the inverter 1 (electronic device) including the same according to the first embodiment of the present invention described above include a case body 10 having accommodating space 10b in which the circuit substrate 2 (electric circuit) can be accommodated and opened to one side, and a cover 20 attached to the case body 10 so as to close the opening of the case body 10. The cover 20 includes an annular first region portion 21 in contact with the case body 10, a second region portion 22 located on an inner peripheral side of the first region portion 21, a third region portion 23 located between the first region portion 21 and the second region portion 22 and connected to the first region portion 21 and the second region portion 22, and a rib 25 (reinforcement portion) extending on the third region portion 23 and connected to the second region portion 22. The second region portion 22 is configured such that the mass per unit area when viewed from the attachment direction D of the cover 20 to the case body 10 is larger than the third region portion 23. The rib 25 (reinforcement portion) has a notch 26 provided at a position excluding a distal end portion in the extending direction.

According to this configuration, by providing the notch 26 with respect to the rib 25 (reinforcement portion) connected to the second region portion 22, the position of the notch 26 becomes relatively low rigidity in the third region portion 23 where the rib 25 (reinforcement portion) is provided, and thus the position of the second region portion 22 having a relatively large weight becomes a portion that is relatively likely to vibrate, and the vibration can be suppressed without excessively increasing the weight of the second region portion 22. Furthermore, by adjusting a combination of a shape such as a position, a length, a width, and a height of the rib 25 (reinforcement portion) and a shape such as a position, a length, and a depth of the notch 26, the natural frequency of the cover 20 can be adjusted to a frequency at which human hearing sensitivity is low and a frequency at which resonance with other members does not occur. That is, the structure has a high degree of freedom in adjustment of the natural frequency of the member, and the vibration can be suppressed without excessively increasing the weight of the cover 20.

In addition, in the case 3 according to the present embodiment, the position of the second region portion 22 of the cover 20 is set such that the position of the antinode of the primary vibration mode of the cover 20 is within the range of the second region portion 22.

According to this configuration, since the vibration at the position of the antinode of the primary vibration mode of the cover 20 is suppressed by the second region portion 22 having a relatively large weight, the amplitude of the antinode can be reduced.

In the cover 20 of the case 3 according to the present embodiment, the notch 26 is formed from a certain position in the rib 25 (reinforcement portion) to a position reaching the second region portion 22.

According to this configuration, a region having a relatively large amplitude can be concentrated on the second region portion 22. In this case, the region having a relatively large amplitude can be further reduced by the relatively large weight of the second region portion 22.

In the case 3 according to the present embodiment, the cover 20 is a member having the longitudinal direction L, and the rib 25 (reinforcement portion) extends in the direction along the longitudinal direction L of the cover 20.

According to this configuration, the portion in the longitudinal direction which is the portion of low rigidity of the cover 20 can be increased in rigidity by the rib 25.

In the cover 20 of the case 3 according to the present embodiment, the second region portion 22 has a rectangular parallelepiped bulging portion that bulges out more than the third region portion 23.

According s configuration, since the bulging portion 22a of the second region portion 22 has a simple shape, manufacturing of the part of the cover 20 can be facilitated.

In addition, in the cover 20 of the case 3 according to the present embodiment, the reinforcement portion for increasing the rigidity of the third region portion 23 is configured by the ribs 25 respectively connected to the four corners extending in the bulging direction (the external side of the case 3) of the rectangular parallelepiped bulging portion 22a of the second region portion 22.

According to this configuration, higher rigidity and lower vibration of the cover 20 can be achieved by the weight and the reinforcement portion having a simple portion structure.

Second Embodiment

Figure 9:
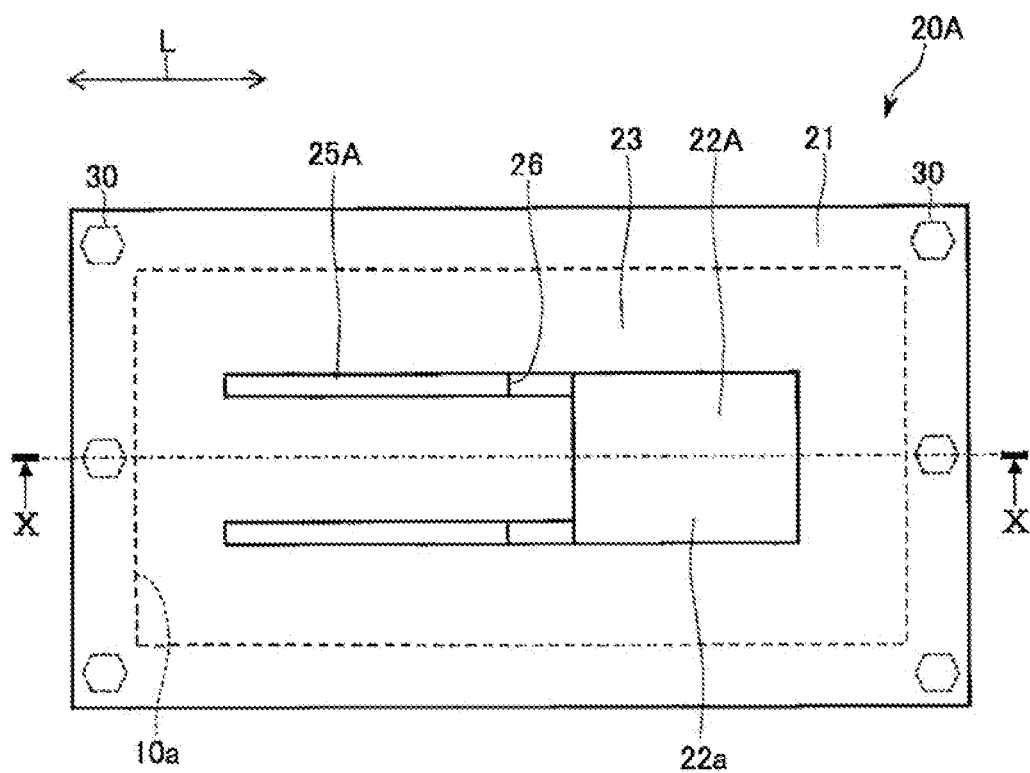
FIG. 9 is a plan view illustrating a cover of a case according to a second embodiment of the present invention.
Figure 10:
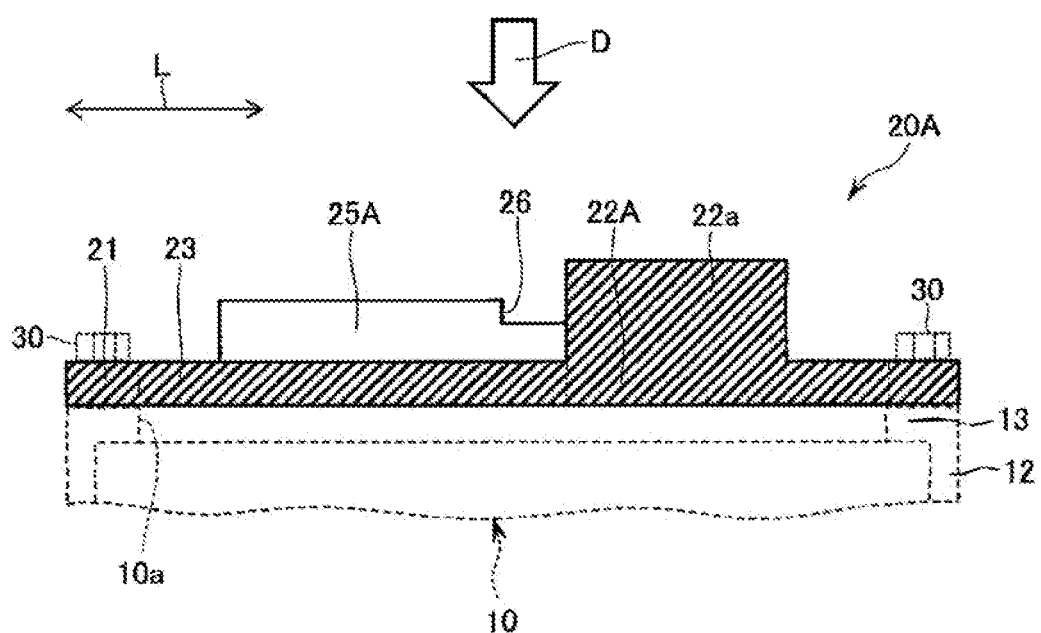
FIG. 10 is a cross-sectional view of the cover of the case according to the second embodiment of the present invention illustrated in FIG. 9 as viewed along an arrow X-X.

Next, a case according to a second embodiment of the present invention will be described with reference to FIGS. 9 and 10. FIG. 9 is a plan view illustrating a cover of a case according to the second embodiment of the present invention. FIG. 10 is a cross-sectional view of the cover of the case according to the second embodiment of the present invention illustrated in FIG. 9 as viewed along an arrow X-X. Note that, in FIGS. 9 and 10, components denoted by the same reference numerals as those illustrated in FIGS. 1, 7, and 8 are similar parts, and thus a detailed description thereof will be omitted.

A cover 20A of the case according to the second embodiment of the present invention shown in FIGS. 9 and 10 is different from the cover 20 of the case according to the first embodiment (see FIGS. 7 and 8) mainly in that the arrangement and the number of ribs 25A serving as reinforcement portions of the third region portion 23 are different, and the position of the second region portion 22A in the cover 20A is different.

Specifically, the second region portion 22A of the cover 20A is at a position shifted to one side (right side in FIGS. 9 and 10) in the longitudinal direction L from the position of the central portion of the cover 20A. The reinforcement portion of the third region portion 23 is configured by two ribs 25A provided on the outer surface of the third region portion 23 (the surface on the external side of the case 3 (see FIG. 1)). The two ribs 25A are connected in correspondence with two corners adjacent in the short direction (the up and down direction in FIG. 9) among the four corners extending in the bulging direction (the up and down direction in FIG. 10) in the rectangular parallelepiped bulging portion 22a of the second region portion 22A, and extended to a certain position not reaching the first region portion 21 along the longitudinal direction L of the cover 20 A. That is, the two ribs 25A are not disposed on both sides (left and right sides in FIGS. 9 and 10) in the longitudinal direction L of the second region portion 22A, but are disposed biased to one side (left side in FIGS. 9 and 10) in the longitudinal direction L of the second region portion 22 A.

As in the first embodiment, each rib 25A is provided with a notch 26 at a position excluding the distal end portion in the extending direction. The shape such as the length, the width (thickness), and the height of each rib 25A and the shape such as the position of the notch 26 and the length and the depth of the notch 26 are set so as to avoid the primary natural frequency of the cover 20A from becoming a region of a natural frequency of another member such as the case body 10 or a region of a frequency where human hearing sensitivity is high (e.g., a range of 1 kHz to 5 kHz.). Furthermore, the shapes of the rib 25A and the notch 26 are set such that the position of the antinode of the primary vibration mode of the cover 20A is within the range of the second region portion 22A (a position shifted to one side in the longitudinal direction L from the central portion of the cover 20A).

In the present embodiment as well, as in the first embodiment, the notch 26 is provided at a position excluding the distal end portion of the rib 25A provided in the third region portion 23. Thus, the rigidity of the portion in the vicinity of the second region portion 22A (weight portion) in the third region portion 23 increased in rigidity by the rib 25A can be intentionally lowered by the notch 26. As a result, since a region having a relatively large amplitude is generated in or at the periphery of the second region portion 22A (weight portion), the vibration having a relatively large amplitude can be further suppressed by the relatively heavy weight second region portion 22 as compared with a case where the notch 26 is not provided in the rib 25A. Therefore, the radiation sound from the cover 20A is reduced. Note that in order to concentrate a region having a relatively large amplitude to the second region portion 22A (weight portion), it is desirable to provide the notch 26 up to a position reaching the second region portion 22A as illustrated in FIGS. 9 and 10.

Furthermore, in the present embodiment, similarly to the first embodiment, the position of the antinode of the primary vibration mode of the cover 20A can be moved by adjusting the position and shape (length, depth) of the notch 26 in addition to the adjustment of the installation position and shape (length, width, height) of the rib 25A.

Therefore, it is easy to adjust the position of the antinode of the primary vibration mode of the cover 20 A to the central portion of the second region portion 22A (weight portion).

In the present embodiment, as in the first embodiment, the primary natural frequency of the cover 20A can be changed by adjusting the position and shape (length, depth) of the notch 26 in addition to the adjustment of the installation position and shape (length, width, height) of the rib 25A. That is, there are many design parameters for setting the frequency of the primary vibration mode of the cover 20A with respect to the rib 25A and the notch 26. Therefore, the primary natural frequency of the cover 20A can be adjusted to a frequency range in which human hearing sensitivity is low and a frequency range in which resonance with other members does not occur by adjusting the rib 25A and the notch 26.

As described above, in the second embodiment of the present invention, similarly to the first embodiment, the structure has a high degree of freedom in adjusting the natural frequency of the member, and the vibration can be suppressed without excessively increasing the weight of the cover 20A.

In addition, in the cover 20A of the case according to the present embodiment, the reinforcement portion for increasing the rigidity of the third region portion 23 is configured by the rib 25A connected to each of two adjacent corners among the four corners extending in the bulging direction (the external side of the case 3) in the rectangular parallelepiped bulging portion 22a of the second region portion 22A.

According to this configuration, higher rigidity and lower vibration of the cover 20A can be achieved by the reinforcement portion having a simpler structure than the cover 20 according to the first embodiment.

Other Embodiments

In the first and second embodiments described above, an example in which the electronic device of the present invention is applied to the inverter 1 for an electric motor has been described, but the electronic device can also be applied to the inverter 1 for a motor generator. In addition, although an example in which the present invention is applied to the inverter 1 used for the rotation electrical machine 101 has been described, the present invention can also be applied to various electronic devices in which an electric circuit is accommodated in a case.

Note that the present invention is not limited to the embodiments described above, and includes various modified examples. For example, the examples described above have been described in detail for the sake of easy understanding of the present invention, and are not necessarily limited to those having all the described configurations. In addition, a part of the configuration of a certain embodiment can be replaced with a configuration of another embodiment, and the configuration of a certain embodiment can be added with the configuration of another embodiment. Furthermore, for a part of the configuration of each embodiment, other configurations can be added, deleted, and replaced.

For example, in the embodiments described above, an example has been described in which the plurality of ribs 25, 25A are provided along the longitudinal direction L of the cover 20, 20A. However, as long as the rib 25, 25A is connected to the second region portion 22, 22A, installation positions, extending directions, and the like can be arbitrarily adjusted.

Furthermore, in the embodiments described above, an example has been described in which the rib 25, 25A is installed on the outer surface side of the third region portion 23 of the cover 20, 20A (the external side of the case 3). However, the rib 25, 25A may be installed on the inner surface side of the third region portion 23 (the accommodating space 10b side of the case body 10).

Further, in the embodiments described above, the example of the structure in which the bulging portion 22a of the second region portions 22, 22A is bulged out toward the external side of the case 3 has been described. However, a structure in which the bulging portion bulges out toward the accommodating space 10b side of the case body 10 is also possible.

In addition, in the embodiments described above, the example of the structure in which the bulging portion 22a of the second region portions 22, 22A is formed in a rectangular parallelepiped shape has been described. However, the shape of the bulging portion is arbitrary as long as the weight of the second region portion 22, 22A is relatively larger than that of the third region portion 23.

In addition, in the embodiments described above, the example of the cover 20, 20A in which the second region portion 22, 22A, which is the weight portion, and the rib 25, 25A, which is the reinforcement portion, are integrally molded with the third region portion 23 has been described. However, the cover can be manufactured by attaching the bulging portion 22a of the second region portion 22, 22A, that has been separately molded, and the rib 25, 25A, that has been separately molded, to the plate-shaped member including the first region portion 21 and the third region portion 23.

In addition, in the embodiments described above, the example of the configuration in which the first region portion 21 of the cover 20, 20A is the flat plate-shaped outer peripheral portion continuous with the outer peripheral edge of the plate-shaped third region portion 23 has been described. However, the first region portion of the cover may be formed as an annular projecting portion projecting out from the outer peripheral edge of the plate-shaped third region portion 23 toward the case body 10. In this case, a distal end face of the annular projecting portion serving as the first region portion becomes a contact portion with the case body 10.

In the embodiments described above, an example has been described in which the shapes of the cover 20, 20A when viewed from the attachment direction D of the cover 20, 20A to the case body 10 are rectangular shapes having the longitudinal direction L. However, the shapes of the cover 20, 20A are arbitrary in accordance with the shape of the case body of the case.

REFERENCE SIGNS LIST

1 inverter (electronic device)
2 circuit substrate (electric circuit)
3 case
10 case body
10a opening
10b accommodating space
20, 20A cover
21 first region portion
22, 22A second region portion
22a bulging portion
23 third region portion
25, 25A rib (reinforcement portion)
26 notch

The invention claimed is:

1. A case comprising:
a case body interiorly including an accommodating space in which an electric circuit is accommodatable, and being opened to one side; and
a cover attached to the case body so as to close an opening of the case body,
wherein
the cover includes:
an annular first region portion in contact with the case body,
a second region portion located on an inner peripheral side of the first region portion,
a third region portion located between the first region portion and the second region portion, and connected to the first region portion and the second region portion, and
a reinforcement portion extending on the third region portion and being connected to the second region portion,
the second region portion is configured such that a mass per unit area when viewed from an attachment direction of the cover to the case body is larger than that of the third region portion, and
the reinforcement portion is provided with a notch at a position excluding a distal end portion in an extending direction of the reinforcement portion.

2. The case according to claim 1, wherein a position of the second region portion is set such that a position of an antinode of a primary vibration mode of the cover is within a range of the second region portion.

3. The case according to claim 1, wherein the notch is formed from a certain position in the reinforcement portion to a position reaching the second region portion.

4. The case according to claim 1, wherein
the cover is a member having a longitudinal direction, and
the reinforcement portion extends in a direction along the longitudinal direction of the cover.

5. The case according to claim 1, wherein the second region portion has a rectangular parallelepiped bulging portion bulging out than the third region portion.

6. The case according to claim 5, wherein the reinforcement portion is configured by a rib connected to each of four corners extending in the bulging direction of the bulging portion.

7. The case according to claim 5, wherein the reinforcement portion is configured by a rib connected to each of two adjacent corners among four corners extending in the bulging direction of the bulging portion.

8. An electronic device comprising:
an electric circuit; and
a case accommodating the electric circuit,
wherein the case is the case according to claim 1.

* * * * *